United States Patent
Forrest et al.

(10) Patent No.: US 11,744,089 B2
(45) Date of Patent: Aug. 29, 2023

(54) MULTIJUNCTION ORGANIC PHOTOVOLTAICS INCORPORATING SOLUTION AND VACUUM DEPOSITED ACTIVE LAYERS

(71) Applicant: The Regents of the University of Michigan, An Arbor, MI (US)

(72) Inventors: Stephen R. Forrest, Ann Arbor, MI (US); Brian Lassiter, San Francisco, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/414,933

(22) PCT Filed: Jul. 19, 2013

(86) PCT No.: PCT/US2013/051354
§ 371 (c)(1),
(2) Date: Jan. 15, 2015

(87) PCT Pub. No.: WO2014/015288
PCT Pub. Date: Jan. 23, 2014

(65) Prior Publication Data
US 2015/0207088 A1 Jul. 23, 2015

Related U.S. Application Data

(60) Provisional application No. 61/673,604, filed on Jul. 19, 2012.

(51) Int. Cl.
*H10K 30/20* (2023.01)
*B82Y 10/00* (2011.01)
(Continued)

(52) U.S. Cl.
CPC ............ *H10K 30/211* (2023.02); *B82Y 10/00* (2013.01); *H10K 71/12* (2023.02); *H10K 71/164* (2023.02);
(Continued)

(58) Field of Classification Search
CPC ............ H01L 51/0001; H01L 51/0003; H01L 51/001; H01L 51/0046; H01L 51/0047;
(Continued)

(56) References Cited

U.S. PATENT DOCUMENTS

2010/0084011 A1* 4/2010 Forrest .................. B82Y 10/00
136/255
2012/0090685 A1 4/2012 Forrest et al.

OTHER PUBLICATIONS

Lee et al. "Transparent electrode with ZnO nanoparticles in tandem organic solar cells". Solar energy materials & solar cells 95 (2011) 365-368.*

(Continued)

*Primary Examiner* — Lindsey A Buck
(74) *Attorney, Agent, or Firm* — Finnegan, Henderson, Farabow, Garrett & Dunner, LLP

(57) ABSTRACT

There is disclosed an organic photovoltaic device comprising at least one first subcell comprising at least one first small molecular weight material deposited by solution processing, and at least one second subcell comprising a weight at least one second small molecular material deposited by vacuum evaporation. Also disclosed herein is a method for preparing an organic photovoltaic device comprising at least one first subcell comprising at least one first small molecular weight material and at least one second subcell comprising at least one second small molecular weight material, the method comprising depositing at least one first small weight material by solution processing; and depositing at least one second small weight material by vacuum evaporation.

24 Claims, 2 Drawing Sheets a) front-only    b) back-only    c) tandem

(51) Int. Cl.
*H10K 71/12* (2023.01)
*H10K 71/16* (2023.01)
*H10K 30/57* (2023.01)
*H10K 30/30* (2023.01)
*H10K 85/20* (2023.01)
*H10K 85/30* (2023.01)
*H10K 85/60* (2023.01)

(52) U.S. Cl.
CPC .......... *H10K 30/353* (2023.02); *H10K 30/57* (2023.02); *H10K 85/211* (2023.02); *H10K 85/215* (2023.02); *H10K 85/311* (2023.02); *H10K 85/322* (2023.02); *H10K 85/621* (2023.02); *H10K 85/654* (2023.02); *Y02E 10/549* (2013.01)

(58) Field of Classification Search
CPC ............ H01L 51/0078; H01L 51/4246; H01L 51/4253; Y02E 10/549
USPC .................... 136/252, 255, 263, 265; 438/74
See application file for complete search history.

(56) References Cited

OTHER PUBLICATIONS

Yuan et al. "Intermediate layers in tandem organic solar cells". Green, vol. 1 (2011), pp. 65-80.*
Kim et al. "Efficiency enhanement of P3HT/PCBM bulk heterojunction solar cells by attaching zinc pththalocyanine dye to the chain-end of P3HT". J. Mater. Chem. 2011, 21, 17209.*
Ma et al. "Solution processable boron subphthalocyanine deivatives as active materials for organic photovoltaics". Proc. SPIE 7416, Organic photovoltaics X, 74161 E. 2009.*
Wei et al. "Squaraine Donors for High Efficiency Small Molecule Solar Cells". Jun. 19-24, 2011 37th IEEE Photovoltaic Specialists Conference. (Year: 2011).*
Bruder, et al., "Efficient organic tandem cell combining a solid state dye-sensitized and a vacuum deposited bulk heterojunction solar cell," Solar Energy Materials and Solar Cells, pp. 1896-1899 (2009).
Kim et al., "Influence of surface morphology evolution of SubPc layers on the performance of SubPc/C organic photovoltaic cells," Applied Physics Letters, p. 193303 (2011).

* cited by examiner

MULTIJUNCTION ORGANIC PHOTOVOLTAICS INCORPORATING SOLUTION AND VACUUM DEPOSITED ACTIVE LAYERS

CROSS-REFERENCE TO RELATED APPLICATION

This application claims the benefit of U.S. Provisional Application No. 61/673,604, filed Jul. 19, 2012, which is incorporated herein by reference in its entirety.

STATEMENT REGARDING FEDERALLY SPONSORED RESEARCH

This invention was made with U.S. Government support under Contract No. FA9550-10-1-0339, awarded by the Air Force Office of Scientific Research and DE-EE0005310 awarded by the U. S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: University of Michigan and Global Photonic Energy Corporation. The agreement was in effect on and before the date the subject matter of the present disclosure was prepared, and was made as a result of activities undertaken within the scope of the agreement.

There is disclosed an organic photovoltaic device (OPV) comprising at least one first subcell comprising at least one first small molecular weight material deposited by solution processing and at least one second subcell comprising a weight at least one second small molecular material deposited by vacuum evaporation. Also disclosed herein is a method for preparing the same.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m$^2$, AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF=\{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF^*(I_{SC}^*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

The current-voltage characteristics of organic heterojunctions are often modeled using the generalized Shockley equation derived for inorganic diodes. However, since the Shockley equation does not rigorously apply to organic semiconductor donor-acceptor (D-A) heterojunctions (HJs), the extracted parameters lack a clear physical meaning.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction may also play an important role.

The energy level offset at the organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Organic PV cells have many potential advantages when compared to traditional silicon-based devices. Organic PV cells are light weight, economical in materials use, and can be deposited on low cost substrates, such as flexible plastic foils. However, organic PV devices typically have relatively low quantum yield (the ratio of photons absorbed to carrier pairs generated, or electromagnetic radiation to electricity conversion efficiency), being on the order of 1% or less. This is, in part, thought to be due to the second order nature of the intrinsic photoconductive process. That is, carrier generation requires exciton generation, diffusion, and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A^* \eta_{ED}^* \eta_{CC}$$

$$\eta_{EXT} = \eta_A^* \eta_{INT}$$

The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

SUMMARY

There is disclosed an organic photovoltaic device (OPV) comprising at least one first subcell comprising at least one first small molecular weight material deposited by solution processing; and at least one second subcell comprising a weight at least one second small molecular material deposited by vacuum evaporation.

Also disclosed herein is a method of preparing an organic photovoltaic device comprising at least one first subcell comprising at least one first small molecular weight material and at least one second subcell comprising at least one second small molecular weight material comprising depositing at least one first small molecular weight material by solution processing; and depositing at least one second small molecular weight material by vacuum evaporation.

In some embodiments, the OPV comprises two or more subcells. In one embodiment, the OPV comprises two subcells. In one embodiment, the OPV comprises three subcells. In another embodiment, the OPV comprises four subcells. In yet another experiment, the OPV comprises more than four subcells.

In one embodiment, each subcell comprises at least one donor-acceptor heterojunction.

In one embodiment, the solution processing is spin-coating, doctor-blading, or spray-coating process. In one embodiment, the vacuum evaporation is vacuum thermal evaporation or organic vapor phase deposition.

In one embodiment, the device comprises a two terminal series architecture. In another embodiment, the device comprises a three-terminal parallel architecture. In yet another embodiment, the device comprises a four-terminal architecture.

In one embodiment, the device comprises two heterojunctions with a two terminal series architecture.

In one embodiment, the power conversion efficiency (PCE) of the device is improved compared to the first subcell or the second subcell, or the first and second subcells combined.

In one embodiment, the at least one first small molecular weight material or the at least one second small molecular weight material comprises at least one donor material.

In one embodiment, the at least one donor material is chosen from boron subphthalocyanine (SubPc), copper phthalocyanine (CuPc), chloroaluminium phthalocyanine (ClAlPc), tin phthalocyanine (SnPc), pentacene, tetracene, diindenoperylene (DIP), and squaraine (SQ). In one embodiment, the donor is chosen from 2,4-bis[4-(N,N-diphenylamino)-2,6-dihydroxyphenyl]squaraine (DPSQ) and SubPc.

In one embodiment, the at least first subcell further comprises a material deposited by vacuum evaporation. In one embodiment, the material deposited by vacuum evaporation comprises an acceptor layer.

In one embodiment, the at least second subcell further comprises a material deposited by solution processing.

In one embodiment, the at least one first small molecular weight material and/or the at least one second small molecular weight material further comprises at least one acceptor material.

In one embodiment, the at least one acceptor is chosen from fullerene, 3,4,9,10-perylenetetracarboxylicbis-benzimidazole (PTCBI), phenyl-$C_{61}$-butyric-acid-methyl ester ([60]PCBM), phenyl-$C_{71}$-butyric-acid-methyl ester ([70]PCBM), thienyl-$C_{61}$-butyric-acid-methyl ester ([60]ThCBM), and hexadecafluorophthalocyanine ($F_{16}$CuPc). Fullerene includes, for example, $C_{60}$ and $C_{70}$. Fullerene includes, for example, $C_{60}$ and $C_{70}$.

In one embodiment, the at least one second material comprises a small molecule:fullerene layer. In one embodiment, the at least one heterojunction comprises a SubPc:fullerene layer. In one embodiment, the heterojunction comprises SubPc:$C_{70}$ layer.

In one embodiment, the first subcell and/or the second subcell further comprises an electron blocking layer.

In one embodiment, the electron blocking layer comprises BCP, BPhen, PTCBI, TPBi, Ru(acac)$_3$, and Alq$_2$OPH.

In one embodiment, the first subcell and/or the second subcell further comprises a buffer layer. In another embodiment, the buffer layer comprises MoO$_3$.

In one embodiment, the photovoltaic device further comprises a charge recombination or a charge transfer layer between the at least one first subcell and the at least one second subcell. In one embodiment, the charge recombination layer, or charge transfer layer comprises a material chosen from Al, Ag, Au, MoO$_3$, and WO$_3$.

Also described is a method of preparing an organic photovoltaic device (OPV) comprising at least one first subcell comprising at least one first small weight material and at least one second subcell comprising at least one second small weight material, the method comprising:

depositing at least one first small weight material by solution processing; and depositing at least one second small weight material by vacuum evaporation.

In one embodiment, the at least one first subcell is closer to the substrate of the device and is referred to as the front subcell, and the at least one second subcell, further away from the substrate, is referred to as a back subcell. In another embodiment, the at least one first subcell is a back subcell, and the at least one second subcell is a front subcell.

DETAILED DESCRIPTION

Figure 1:
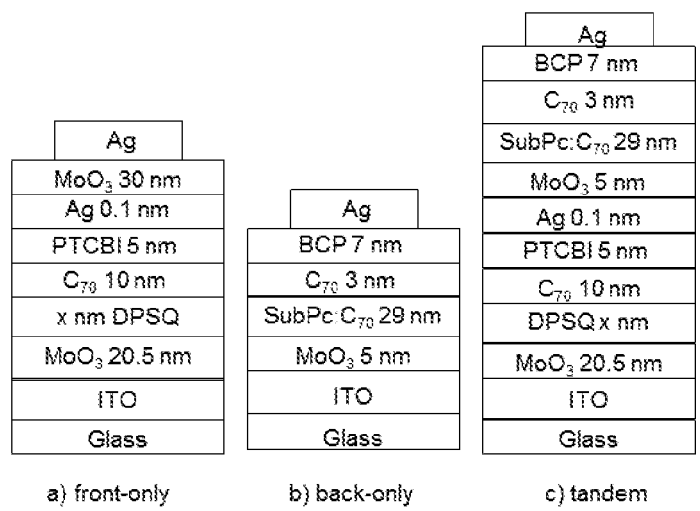
FIG. 1. Schematic diagram of the structure of three devices: a) front-only, b) back-only, and c) tandem. The illustrations are not to scale.

There is disclosed an organic photovoltaic device (OPV) comprising at least one first subcell comprising at least one first small molecular weight material deposited by solution processing, and at least one second subcell comprising a weight, and at least one second small molecular material deposited by vacuum evaporation.

Also disclosed herein is a method for preparing an organic photovoltaic device comprising at least one first subcell comprising at least one first small weight material and at least one second subcell comprising at least one second small weight material, the method comprising depositing at least one first small weight material by solution processing; and depositing at least one second small weight material by vacuum evaporation.

Organic photosensitive optoelectronic devices of the embodiments described herein may function as a PV device, photodetector or photoconductor.

To increase the power conversion efficiency (PCE) of organic photovoltaics (OPVs), one may incorporate multiple donor-acceptor heterojunctions. "Donor-acceptor heterojunction," "heterojunction," and "photoactive region," as used herein, are interchangeable. In one embodiment, the OPV comprises two or more heterojunctions. In one embodiment, the OPV comprises two heterojunctions. In another embodiment, the OPV comprises three heterojunctions. In yet another embodiment, the OPV comprises four or more heterojunctions. Each subcell comprises at least one heterojunction.

There are several common architectures for two-junction OPVs: for example, (1) two-terminal series, where the anode of one subcell is adjacent to the cathode of the other subcell; (2) three-terminal parallel, where either the anodes of each subcell or the cathodes of each subcell are common; or (3) four-terminal, where the subcells are not connected by adjacent layers. In other embodiments, three, four, or more heterojunctions are stacked. The embodiments described herein apply to all types of architecture.

A two-terminal series device is known as a tandem device. The organic PV device (OPV) may exist as a tandem device comprising one or more donor-acceptor heterojunctions. A tandem device may comprise charge transfer material, electrodes, or charge recombination material between the tandem donor-acceptor heterojunctions.

As used herein, a small molecular weight material means a material with molecular weight no more than 5000 Daltons, for example, no more than 4500 Daltons, no more than 4000 Daltons, no more than 3500 Daltons, no more than 3000 Daltons, no more than 2500 Daltons, no more than 2000 Daltons, no more than 1500 Daltons, or no more than 1000 Daltons, as opposed to a polymeric material. As used herein, "small molecular weight material" is used interchangeably with "small molecule."

As used herein, "material" and "layer" are used interchangeably, referring to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

Subcell, as used herein, means a component of the photovoltaic device which comprises at least one a donor-acceptor heterojunction. "Donor-acceptor heterojunction," "heterojunction," and "photoactive region," as used herein, are interchangeable. The heterojunction may be formed by a planar, bulk, mixed, hybrid-planar-mixed, or nanocrystalline bulk heterojunction. For example, the heterojunction may comprise mixtures of two or more materials chosen from: boron subphthalocyanine (SubPc), $C_{60}$, $C_{70}$, squaraine, copper phthalocyanine (CuPc), tin phthalocyanine (SnPc), chloroaluminum phthalocyanine (ClAlPc), and diindenoperylene (DIP).

As used herein, "front" or "front subcell" means the subcell closest to the substrate structure, while "back" or "back subcell" refers to the subcell furthest away from the substrate structure.

In some embodiments, the organic materials or organic layers, or organic thin films, can be applied via solution processing, such as by one or more techniques chosen from spin-coating, spin-casting, spray coating, dip coating, doctor-blading, inkjet printing, or transfer printing. For molecules which degrade before evaporating, solution-processing technique can be used to achieve uniform, high-quality thin films for electronic purposes.

In other embodiments, the organic materials may be deposited using vacuum evaporation, such as vacuum thermal evaporation, organic vapor phase deposition, or organic vapor-jet printing.

With regard to donor materials that may be used in the present disclosure, non-limiting mention is made to those chosen from boron subphthalocyanine (SubPc), copper phthalocyanine (CuPc), chloroaluminium phthalocyanine (ClAlPc), tin phthalocyanine (SnPc), pentacene, tetracene, diindenoperylene (DIP), and squaraine (SQ).

Non-limiting embodiments of the squaraine compound that may be used are those chosen from 2,4-bis [4-(N,N-dipropylamino)-2,6-dihydroxyphenyl]squaraine, 2,4-bis[4-(N,N-diisobutylamino)-2,6-dihydroxyphenyl]squaraine, 2,4-bis[4-(N,N-diphenylamino)-2,6-dihydroxyphenyl] squaraine (DPSQ) and salts thereof.

In one embodiment, the donor materials may be doped with a high mobility material, such as one that comprises pentacene or metal nanoparticles.

In some embodiments, the acceptor materials that may be used in the present disclosure include polymeric or non-polymeric perylenes, polymeric or non-polymeric naphthalenes, and polymeric or non-polymeric fullerenes. Non-limiting mention is made to those chosen from fullerene (for example, $C_{60}$, $C_{70}$), 3,4,9,10-perylenetetracarboxylicbis-benzimidazole (PTCBI), Phenyl-$C_{61}$-Butyric-Acid-Methyl Ester ([60]PCBM), Phenyl-$C_{71}$-Butyric-Acid-Methyl Ester ([70]PCBM), Thienyl-$C_{61}$-Butyric-Acid-Methyl Ester ([60] ThCBM), and hexadecafluorophthalocyanine ($F_{16}$CuPc).

In some embodiments, at least one subcell may further comprise a exciton blocking layer (EBL). In some embodiments, at least one subcell may further comprise a charge transfer layer or charge recombination layer. In some other embodiments, at least one subcell may optionally comprises a buffer layer.

With regard to materials that may be used as an exciton blocking layer, non-limiting mention is made to those chosen from bathocuproine (BCP), bathophenanthroline (BPhen), 3,4,9,10-perylenetetracarboxylicbis-benzimidazole (PTCBI), 1,3,5-tris(N-phenylbenzimidazol-2-yl)benzene (TPBi), tris(acetylacetonato)ruthenium(III) (Ru(acac)$_3$), and aluminum(III)phenolate ($Alq_2OPH$), N,N'-diphenyl-N,N'-bis-alpha-naphthylbenzidine (NPD), aluminum tris(8-hydroxyquinoline) ($Alq_3$), and carbazole biphenyl (CBP).

In one embodiment, the charge transfer layer or charge recombination layer may be chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

In one embodiment, the OPVs described herein further comprises a buffer layer, such as $WO_3$, $V_2O_5$, $MoO_3$, and other oxides.

There may be other layers between a first and a second layer, unless it is specified that the first layer is "in physical contact with" the second layer. For example, a cathode may be described as "disposed over" or "on top of" an anode, even though there are various organic layers in between.

The organic photovoltaic device may comprise at least one electrode. An electrode may be reflective or transparent. In some embodiments, the electrode can be transparent conducting oxides, such as indium tin oxide (ITO), tin oxide (TO), gallium indium tin oxide (GITO), zinc oxide (ZO), and zinc indium tin oxide (ZITO), or transparent conductive polymers, such as polyanaline (PANI). In other embodiments, the electrodes may be composed of metals such as Ag, Au, Ti, Sn, and Al. In other embodiments, at least one electrode is an anode that comprises indium tin oxide (ITO). In another embodiment, the electrode is a cathode that comprises a material chosen from Ag, Au, and Al.

In some embodiments, the organic photovoltaic device further comprises a substrate. Substrate, onto which the device may be grown or placed, may be any suitable material that provides the desired structural properties. The substrate may be flexible or rigid, planar or non-planar. The substrate may be transparent, translucent or opaque. Plastic, glass, and quartz are examples of rigid substrate materials. Plastic and metal foils are examples of flexible substrate materials. The material and thickness of the substrate may be chosen to obtain the desired structural and optical properties. In some embodiments, substrate is stainless steel, such as a stainless steel foil (SUS). SUS substrates are relatively low cost compared to conventional materials, and provide better heat sinks during growth of layers.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

Organic photosensitive optoelectronic devices of the embodiments described herein may function as a PV device, photodetector, or photoconductor. Whenever the organic photosensitive optoelectronic devices described herein function as a PV device, the materials used in the photoconductive organic layers and the thicknesses thereof may be selected, for example, to optimize the external quantum efficiency of the device. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

For example, a tandem organic photovoltaic device may be prepared by first growing a front subcell on to an electrode pre-coated on a substrate, for example, an anode, such as ITO, on a glass substrate. In one embodiment, a front subcell may be prepared by loading a substrate pre-coated with ITO into a high vacuum chamber to be deposited on an optional buffer layer, such as $MoO_3$, by vacuum thermal evaporation process. The substrate can then be deposited with DPSQ films from a solution by spin-coating processing. The substrate may then be deposited with organic material by vacuum evaporation. It may then be exposed to saturated solvent vapor, such as chloroform, to create a favorable film morphology. After being transferring back to vacuum chamber, a charge recombination layer, such as Ag, and/or an electron transport layer, such as $MoO_3$, may be deposited on to the substrate by vacuum process.

In another embodiment, the back subcell may be prepared by evaporating a mixed film of SubPc and $C_{70}$. In one embodiment, a film of electron blocking layer, such as BCP, may be deposited by vacuum evaporation. Finally, a second electrode, such as a cathode, such as Ag, may be deposited in the same way.

The simple layered structure illustrated in FIG. 1 is provided by way of non-limiting example, and it is understood that embodiments described herein may be used in connection with a wide variety of other structures. The specific materials and structures described are exemplary in nature, and other materials and structures may be used. Functional organic photosensitive optoelectronic devices may be achieved by combining the various layers described in different ways, or layers may be omitted entirely, based on design, performance, and cost factors. Other layers not specifically described may also be included. Materials other than those specifically described may be used. Although the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. Organic layers that are not a part of the photoactive region, i.e., organic layers that generally do not absorb photons that make a significant contribution to photocurrent, may be referred to as "non-photoactive layers." Examples of non-photoactive layers include EBLs and anode-smoothing layers. Other types of non-photoactive layers may also be used.

The methods and devices described herein will be further described by the following non-limiting examples, which are intended to be purely exemplary.

Example 1

A tandem organic photovoltaic device having a solution-processed small molecule donor layer and evaporated fullerene acceptor layer for the front subcell and an evaporated small molecule:fullerene back subcell was prepared. As noted previously, although demonstrated here are two-heterojunction devices in the two-terminal series architecture, the work also applies to other types of architecture.

The tandem organic photovoltaic devices were grown on 150 nm thick layers of indium tin oxide (ITO) pre-coated onto glass substrates. Prior to deposition, the ITO surface was cleaned in a surfactant and a series of solvents and then exposed to ultraviolet-ozone for 10 min before loading into a high vacuum chamber (base pressure $<10^{-7}$ Torr) where $MoO_3$ was thermally evaporated at ~0.1 nm/s. Substrates were then transferred to a $N_2$ glovebox where 2,4-bis[4-(N, N-diphenylamino)-2,6-dihydroxyphenyl]squaraine (DPSQ) films were spin-coated from filtered 1.6 mg/ml solutions in chloroform.

Substrates were once again transferred into the high vacuum chamber for deposition of purified organics at 0.1 nm/s, followed by transfer back into the glovebox and exposure to saturated chloroform vapors for 10 min to create a favorable film morphology. After the substrates was transferred back to the vacuum chamber, a 0.1 nm Ag silver nanocluster recombination layer and a $MoO_3$ transport layer were deposited. For the back cell, a mixed film of boron subphthalocyanine chloride (SubPc) and $C_{70}$ was evaporated where the rate of SubPc deposition was 0.012 nm/s while the rate of $C_{70}$ deposition was varied from 0.02 to 0.08 nm/s.

After a film of BCP was evaporated at 0.1 nm/s, a 100 nm thick Ag cathode deposited at 0.1 nm/s through a shadow mask with an array of 1 mm diameter openings. Current density versus voltage (J-V) characteristics were measured in an ultra-pure $N_2$ ambient, in the dark and under simulated AM1.5G solar illumination from a filtered 300 W Xe lamp. Lamp intensity was varied using neutral density filters. Optical intensities were referenced using an NREL-calibrated Si detector, and photocurrent measurements were corrected for spectral mismatch. Errors quoted correspond to the deviation from the average value of three or more devices on the same substrate.

Example 2

The power conversion efficiency (PCE) for a tandem OPV is compared with individual subcells. The subcell closest to the transparent substrate is referred to as the "front subcell," and the other is referred to as the "back subcell."

Fabricated was a tandem OPV with the following structure: glass/150 nm ITO/20 nm $MoO_3$/13 nm DPSQ/10 nm $C_{70}$/5 nm PTCBI/0.1 nm Ag/5 nm $MoO_3$/29 nm SubPc:$C_{70}$/3 nm $C_{70}$/7 nm BCP/100 nm Ag. The structures are shown schematically in FIG. 1.

Also fabricated were individual devices for each subcell. The "front-only" cell consisted of glass/150 nm ITO/20 nm $MoO_3$/13 nm DPSQ/10 nm $C_{70}$/5 nm PTCBI/0.1 nm Ag/30 nm $MoO_3$/100 nm Ag, while the "back-only" cell consisted of glass/150 nm ITO/5 nm $MoO_3$/29 nm SubPc:$C_{70}$/3 nm $C_{70}$/7 nm BCP/100 nm Ag. The structures are also shown schematically in FIG. 1.

Figure 2:
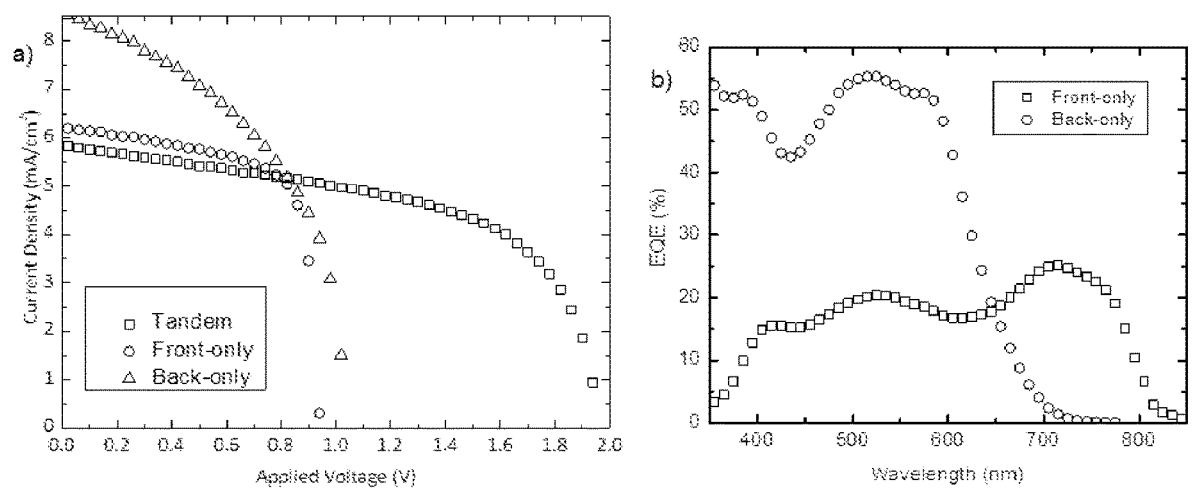
FIG. 2. a) Linear plot of the J-V characteristic of devices corresponding to FIG. 1 under one-sun simulated illumination and b) EQE for the front-only and back-only devices.

Device characteristics are shown in FIG. 2, and the performance of each device is summarized in Table I.

TABLE I

Device performance at one-sun illumination.

| Device | $J_{sc}$ (mA/cm$^2$) | $V_{oc}$ (V) | FF | PCE (%) |
|---|---|---|---|---|
| Back-only | 8.5 | 1.04 | 0.48 | 4.3 ± 0.1 |
| Front-only | 6.1 | 0.94 | 0.71 | 4.1 ± 0.1 |
| Tandem | 5.8 | 1.96 | 0.57 | 6.5 ± 0.1 |

The open-circuit voltage ($V_{OC}$) of the tandem device is 1.96 V, which is nearly the sum of the back-only and front-only devices (1.04 and 0.94 V, respectively). This indicates that each heterojunction is functioning similarly in the tandem device as in the single heterojunction device, and that there is efficient recombination at the Ag recombination zone. Additionally, the short-circuit current ($J_{SC}$) of the tandem device is nearly identical to the smaller of the subcell $J_{SC}$ (5.8 and 6.1 mA/cm$^2$, respectively), indicating that there are few optical losses in the device.

Overall, the tandem device achieves PCE=6.5±0.1, an improvement of over 50% compared to the front-only and back-only devices.

Therefore, a new structure for tandem OPVs is demonstrated. By incorporating one subcell containing a solution-processed small molecular weight material and one subcell containing a vacuum-deposited small molecular weight material, substantially improved performance compared to the single-heterojunction devices has been achieved.

Although the present disclosure is described with respect to particular examples and embodiments, it is understood that the devices described herein are not limited to these examples and embodiments. The embodiments as claimed may therefore include variations from the particular examples and preferred embodiments described herein, as will be apparent to one of skill in the art.

What is claimed is:

1. An organic photovoltaic device, comprising:
   at least one first subcell comprising a first donor-acceptor heterojunction, wherein the first donor-acceptor heterojunction comprises at least one solution processed first small molecular weight material;
   at least one second subcell comprising a second donor-acceptor heterojunction, wherein the second donor-acceptor heterojunction comprises at least one vacuum evaporated second small molecular weight material,
   wherein the at least one first small molecular weight material comprises a squaraine;
   wherein the at least one first and second small molecular weight materials do not comprise a polymer material,
   wherein the at least one vacuum evaporated second small molecular weight material is thereafter exposed to chloroform, and
   wherein the power conversion efficiency of the organic photovoltaic device is improved by over 50% compared to the power conversion efficiency of each of the at least one first subcell and the at least one second subcell.

2. The organic photovoltaic device of claim 1, wherein the device comprises more than two subcells.

3. The organic photovoltaic device of claim 1, wherein the device comprises a two-terminal series architecture.

4. The organic photovoltaic device of claim 1, wherein the device comprises a three-terminal series architecture.

5. The organic photovoltaic device of claim 1, wherein the device comprises a four-terminal series architecture.

6. The organic photovoltaic device of claim 1, wherein the squaraine comprises 2,4-bis[4-(N,N-diphenylamino)-2,6-dihydroxyphenyl]squaraine (DPSQ).

7. The organic photovoltaic device of claim 1, wherein the at least one first subcell further comprises a vacuum evaporated material.

8. The organic photovoltaic device of claim 7, wherein the vacuum evaporated material of the at least one first subcell comprises an acceptor layer.

9. The organic photovoltaic device of claim 1, wherein the at least one second subcell further comprises a solution processed material.

10. The organic photovoltaic device of claim 1, wherein the at least one second small molecular weight material comprises at least one acceptor material.

11. The organic photovoltaic device of claim 10, wherein the at least one acceptor material is chosen from fullerene, 3,4,9,10-perylenetetracarboxylicbis-benzimidazole (PTCBI), phenyl-$C_{61}$-butyric-acid-methyl ester ([60]PCBM), phenyl-$C_{71}$-butyric-acid-methyl ester ([70]PCBM), thienyl-$C_{61}$-butyric-acid-methyl ester ([60]ThCBM), and hexadecafluorophthalocyanine ($F_{16}$CuPc).

12. The organic photovoltaic device of claim 11, wherein the at least one acceptor material comprises $C_{70}$.

13. The organic photovoltaic device of claim 1, wherein the at least one second small molecular weight material comprises a small molecule:fullerene layer.

14. The organic photovoltaic device of claim 13, wherein the at least one second small molecular weight material comprises a SubPc:fullerene layer.

15. The organic photovoltaic device of claim 1, wherein the at least one first subcell and/or the at least one second subcell further comprises an electron blocking layer.

16. The organic photovoltaic device of claim 15, wherein the electron blocking layer comprises at least one of BCP, BPhen, PTCBI, TPBi, Ru(acac)$_3$, and Alq$_2$OPH.

17. The organic photovoltaic device of claim 1, wherein the at least one first subcell and/or the at least one second subcell further comprises a buffer layer.

18. The organic photovoltaic device of claim 1, further comprising a charge recombination or a charge transfer layer between the at least one first subcell and the at least one second subcell.

19. A method of preparing an organic photovoltaic device comprising at least one first subcell comprising a first donor-acceptor heterojunction, wherein the first donor-acceptor heterojunction comprises at least one first small molecular weight material, and at least one second subcell comprising a second donor-acceptor heterojunction, wherein the second donor-acceptor heterojunction comprises at least one second small molecular weight material, the method comprising:
  depositing the at least one first small molecular weight material by solution processing;
  depositing the at least one second small molecular weight material by vacuum evaporation; and
  exposing the at least one vacuum evaporated second small molecular weight material to chloroform,
  wherein the at least one first small molecular weight material comprises a squaraine; and
  wherein the at least one first and second small molecular weight materials do not comprise a polymer material.

20. The method of claim 19, wherein the solution processing is spin-coating, doctor-blading, spray-coating, inkjet printing, or transfer printing.

21. The method of claim 19, wherein the vacuum evaporation is vacuum thermal evaporation or organic vapor phase deposition.

22. The method of claim 19, wherein the squaraine comprises 2,4-bis[4-(N,N-diphenylamino)-2,6-dihydroxyphenyl]squaraine (DPSQ).

23. The method of claim 19, wherein the at least one first subcell further comprises at least one acceptor material, the method further comprising depositing the at least one acceptor material by vacuum evaporation.

24. The method of claim 19, wherein the at least one second small molecular weight material comprises a small molecule:fullerene layer.

* * * * *